US009412448B2

(12) United States Patent
Di Pendina et al.

(10) Patent No.: US 9,412,448 B2
(45) Date of Patent: Aug. 9, 2016

(54) C-ELEMENT WITH NON-VOLATILE BACK-UP

(71) Applicants: Commissariat à l'énergie atomique et aux énergies alternatives, Paris (FR); Centre National de la Recherche Scientifique, Paris (FR)

(72) Inventors: Grégory Di Pendina, Echirolles (FR); Edith Beigne, Meaudre (FR); Eldar Zianbetov, Echirolles (FR)

(73) Assignees: Commissariat a l'energie atomique et aux energies alternatives (FR); Centre National de la Recherche Scientifique (FR)

( * ) Notice: Subject to any disclaimer, the term of this patent is extended or adjusted under 35 U.S.C. 154(b) by 0 days.

(21) Appl. No.: 14/845,213

(22) Filed: Sep. 3, 2015

(65) Prior Publication Data

US 2016/0071587 A1   Mar. 10, 2016

(51) Int. Cl.
  *G11C 14/00*   (2006.01)
  *G11C 13/00*   (2006.01)
  (Continued)

(52) U.S. Cl.
  CPC ............ *G11C 13/0069* (2013.01); *G11C 11/14* (2013.01); *G11C 11/1675* (2013.01);
  (Continued)

(58) Field of Classification Search
  CPC .......... G11C 14/0072; G11C 14/0081; G11C 14/009; G11C 5/148; H03K 19/215; H03K 19/21; H03K 19/23
  See application file for complete search history.

(56) References Cited

U.S. PATENT DOCUMENTS 4,785,204 A * 11/1988 Terada ................. H03K 19/215
                                                   326/104
6,281,707 B1 * 8/2001 Fairbanks .............. H03K 19/20
                                                   326/58
(Continued)

FOREIGN PATENT DOCUMENTS

WO        0122591 A1    3/2001
WO   2008001270 A1    1/2008

OTHER PUBLICATIONS

"Search Report", issued in parent French Application No. 14/58289 on Apr. 29, 2015.
(Continued)

*Primary Examiner* — Andrew Q Tran
(74) *Attorney, Agent, or Firm* — Kaplan Breyer Schwarz & Ottesen, LLP (57) ABSTRACT

The invention concerns a circuit comprising: a C-element having first and second input nodes and first and second inverters (110, 112) cross-coupled between first and second complementary storage nodes ($\overline{Q}$, Z), the second storage node (Z) forming an output node of the C-element; and a non-volatile memory comprising: a first resistive element (202) having a first terminal coupled to the first storage node ($\overline{Q}$); a second resistive element (204) having a first terminal coupled to the second storage node (Z), at least one of the first and second resistive elements being programmable to have one of at least two resistive states ($R_{min}$, $R_{max}$), wherein a second terminal of the first resistive element (202) is coupled to a second terminal of the second resistive element (204) via a first transistor (210); and a control circuit (232).

12 Claims, 3 Drawing Sheets

(51) Int. Cl.
 G11C 11/14 (2006.01)
 H03K 19/017 (2006.01)
 H03K 19/0185 (2006.01)
 H03K 19/20 (2006.01)
 G11C 11/16 (2006.01)
 G11C 11/22 (2006.01)

(52) U.S. Cl.
 CPC ............ *G11C11/22* (2013.01); *G11C 11/2275* (2013.01); *G11C 13/0004* (2013.01); *H03K 19/01707* (2013.01); *H03K 19/018585* (2013.01); *H03K 19/20* (2013.01)

(56) References Cited

U.S. PATENT DOCUMENTS

| | | | | |
|---|---|---|---|---|
| 6,343,032 | B1 * | 1/2002 | Black | G11C 14/0081 365/157 |
| 6,937,508 | B1 | 8/2005 | Hakkarainen | |
| 7,710,159 | B2 * | 5/2010 | Shinde | H03K 19/01707 326/115 |
| 8,427,197 | B2 * | 4/2013 | Katti | H03K 19/16 326/30 |
| 2012/0105102 | A1 | 5/2012 | Katti | |

OTHER PUBLICATIONS

Mojumder et al., "Magnonic spin-transfer torque MRAM with low power, high speed, and error-free switching", "Transactions on Magnetics", Dec. 15, 2011, pp. 2016-2024, vol. 48, No. 6, Publisher: IEEE; DOI:10.1109/TMAG.2011.2179982; ISSN :0018-9464.

Ioan Mihai Miron et al, "Perpendicular switching of a single ferromagnetic layer induced by in-plane current injection", "Nature"; Aug. 11, 2011, pp. 189-194, vol. 476, Publisher: Macmillan Publishers Limited, DOI: 10.1038/nature10309.11.

Waser et al., "Redox-Based Resistive Switching Memories—Nanoionic Mechanisms, Prospects, and Challenges", "Advanced Materials", Jul. 13, 2009, pp. 2632-2661, vol. 21, No. 25-26, Publisher: Wiley-VCH Verlag Gmbh & Go.; DOI: 10.1002/adma. 200900375.

L. Q. Liu et al., "Spin-Torque Switching with the Giant Spin Hall Effect of Tantalum", 2012, vol. 336, No. 555.

Evgeny Y. Tsymbal, "Spintronics: Electric toggling of magnets", "Nature Materials", Dec. 15, 2011, pp. 12-13, vol. 11, Publisher: Macmillian Publishers Limited; doi:10.1038/nmat3205.

Sasikanth Manipatruni et al, "Voltage and Energy-Delay Performance of Giant Spin Hall Effect Switching for Magnetic Memory and Logic", pp. 1-16 , date not available.

* cited by examiner

C-ELEMENT WITH NON-VOLATILE BACK-UP

The present patent application claims the priority benefit of French patent application FR14/58289, filed Sep. 4, 2014, the contents of which are incorporated herein by reference in its entirety to the maximum extent allowable by law.

FIELD

The present disclosure relates to the field of asynchronous circuits, and in particular to a C-element having a non-volatile memory for data back-up.

BACKGROUND

In contrast with synchronous circuit designs that rely on a clock signal, asynchronous circuits have the advantage of being more or less insensitive to delay variations resulting for example from variations in the manufacturing process. Furthermore, by avoiding the use of a clock, asynchronous circuits have relatively low power consumption. Asynchronous circuits are generally designed to operate based on events determined using a specific handshake protocol.

The basic circuit element of an asynchronous design is based on a circuit known as a C-element or Muller circuit. This circuit includes a volatile latch for storing a state. Thus if the asynchronous circuit is powered down, the data stored by the various C-elements will be lost.

It would be desirable to provide the C-element with the capability of non-volatile storage, so that the state of the circuit can be restored following power down. However, there is a technical problem in providing a compact circuit solution that does not lead to a significant increase in energy consumption.

SUMMARY

It is an aim of embodiments of the present description to at least partially address one or more problems in the prior art.

According to one aspect, there is provided a circuit comprising: a C-element having first and second input nodes and first and second inverters cross-coupled between first and second complementary storage nodes, the second storage node forming an output node of the C-element; and a non-volatile memory comprising: a first resistive element having a first terminal coupled to the first storage node; a second resistive element having a first terminal coupled to the second storage node, at least one of the first and second resistive elements being programmable to have one of at least two resistive states, a data value being represented by the relative resistances of the first and second resistive elements, wherein a second terminal of the first resistive element is coupled to a second terminal of the second resistive element via a first transistor; and a control circuit adapted, during a backup phase of a data bit stored at the first and second storage nodes to the non-volatile memory, to render conductive the first transistor while different logic levels are applied to the first and second input nodes of the C-element.

According to one embodiment, the first transistor is adapted to conduct a write current during the backup phase, and the circuit is arranged such that the write current passes through at least one transistor of each of the first and second inverters during the write phase.

According to one embodiment, the C-element is adapted to receive a first input signal at the first input node and a second input signal at the second input node; and the first inverter comprises: first and second transistors having their control nodes coupled to the first or second storage node; third and fourth transistors coupled in parallel with each other and coupling the first transistor of the first inverter to a supply voltage rail; and fifth and sixth transistors coupled in parallel with each other and coupling the second transistor of the first inverter to the ground voltage rail.

According to one embodiment, the second inverter comprises: first and second transistors having their control nodes coupled to the second or first storage node; and a third transistor coupling the first transistor of the second inverter to the supply voltage rail and having its control node coupled to the ground voltage rail.

According to one embodiment, the fifth and sixth transistors of the first inverter and the second transistor of the second inverter are coupled to a common node, the circuit further comprising a seventh transistor coupled between the common node and the ground voltage rail.

According to one embodiment, the circuit further comprises an eighth transistor coupled between the first resistive element and the ground voltage rail and a ninth transistor coupled between the second resistive element and the ground voltage rail, and the control circuit is further adapted to render conductive the eighth and ninth transistors during a restore phase of the data bit stored by the resistive elements to the storage nodes.

According to one embodiment, the eighth transistor is coupled to the second terminal of the first resistive element, and the ninth transistor is coupled to the second terminal of the second resistive element.

According to one embodiment, at least one of the first and second resistive elements is one of: a spin transfer torque element with in-plane anisotropy; a spin transfer torque element with perpendicular-to-plane anisotropy; a reduction oxide element; a ferro-electric element; and a phase change element.

According to one embodiment, the first and second resistive elements each comprise a third terminal, and the eighth transistor is coupled to the third terminal of the first resistive element, and the ninth transistor is coupled to the third terminal of the second resistive element.

According to one embodiment, the resistive element is of the spin orbit torque magnetic tunnel junction type.

According to a further aspect, there is provided an integrated circuit comprising a plurality of asynchronous blocks each comprising the above circuit.

According to a further aspect, there is provided a method of data backup in a circuit comprising: a C-element having first and second input nodes and first and second inverters cross-coupled between first and second complementary storage nodes, the second storage node forming an output node of the C-element; and a non-volatile memory comprising: a first resistive element having a first terminal coupled to the first storage node; a second resistive element having a first terminal coupled to the second storage node, at least one of the first and second resistive elements being programmable to have one of at least two resistive states, a data value being represented by the relative resistances of the first and second resistive elements, a second terminal of the first resistive element being coupled to a second terminal of the second resistive element via a first transistor, the method comprising: rendering conductive the first transistor while different logic levels are applied to the first and second input nodes of the C-element.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the term "connected" is used to designate a direct connection between to elements, whereas the term "coupled" is used to designate a connection that could be direct, or could be via one or more intermediate elements such as resistors, capacitors or transistors.

Figure 1:
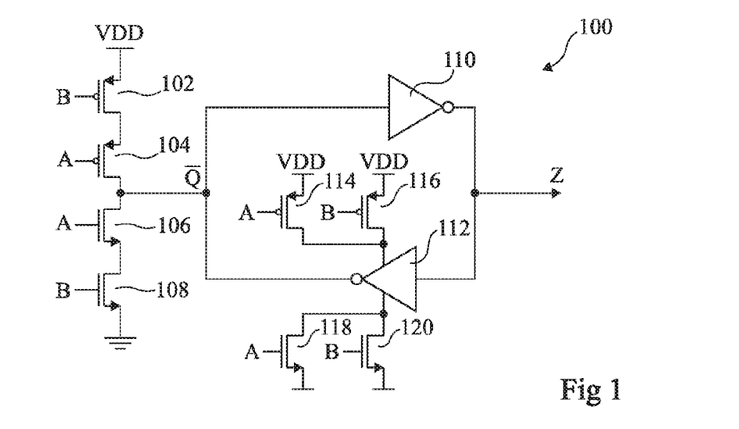
FIG. 1 schematically illustrates an example of a C-element.

FIG. 1 illustrates an example of a C-element 100, also known as a Muller circuit. It comprises a pair of data input nodes for receiving input signals A and B. A pair of transistors 102, 104, which are for example PMOS transistors, are coupled in series with each other between a supply voltage rail VDD and a storage node $\overline{Q}$ of the C-element. A further pair of transistors 106, 108, which are for example NMOS transistors, are coupled in series with each other between the storage node $\overline{Q}$ and a ground voltage rail. The transistors 104 and 106 have their control nodes coupled to the input node receiving the signal A, and the transistors 102 and 108 have their control nodes coupled to the input node receiving the signal B.

Two inverters 110, 112 are cross-coupled between the storage node $\overline{Q}$ and a further storage node Z, which forms the output node of the C-element. The inverter 112 for example has its input coupled to the storage node Z and its output coupled to the storage node $\overline{Q}$, and has its supply terminals coupled to the supply voltage rails via further transistors. In particular, a high supply terminal of inverter 112 is coupled to the supply voltage rail VDD via each of a pair of transistors 114, 116, which are for example PMOS transistors, coupled in parallel with each other. The low supply terminal of inverter 112 is coupled to the ground voltage rail via each of a pair of transistors 118, 120, which are for example NMOS transistors, coupled in parallel with each other. The transistors 114 and 118 have their control nodes coupled to the input node for receiving the signal A, and the transistors 116 and 120 have their control nodes coupled to the other input node for receiving the signal B.

In operation, the C-element for example has an operation defined by the following truth table:

| A | B | Z |
|---|---|---|
| 0 | 0 | 0 |
| 0 | 1 | $Z^{-1}$ |
| 1 | 0 | $Z^{-1}$ |
| 1 | 1 | 1 |

In other words, when the values of the input signals A and B are at the same logic level, the output Z is set to this logic level. When the values of the input signals A and B are at different logic levels from each other, the circuit is in a standby state in which the output Z remains unchanged, in other words the voltage state at the storage nodes $\overline{Q}$ and Z is not modified.

Figure 2:
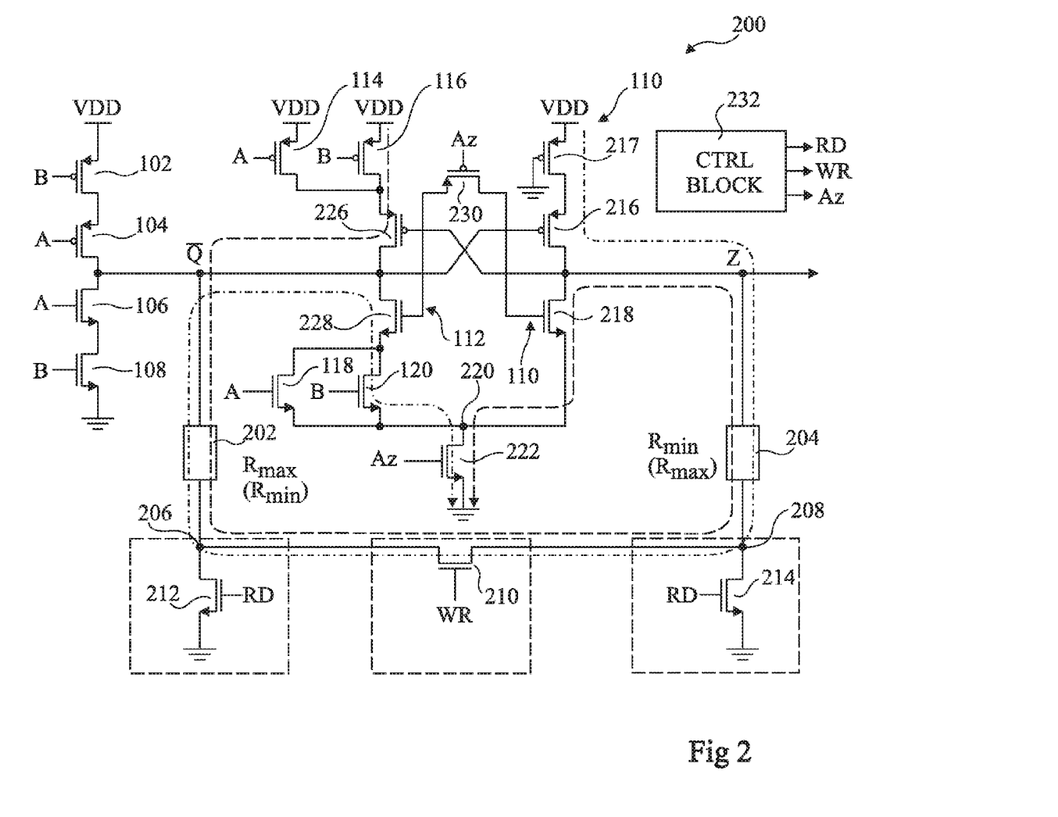
FIG. 2 schematically illustrates a circuit comprising a C-element and a non-volatile memory according to an example embodiment of the present disclosure.

FIG. 2 illustrates a circuit 200 comprising the C-element 100 of FIG. 1, to which has been added a non-volatile memory. The features of the C-element 100 have been labeled with like references in FIG. 2, and will not be described again in detail.

The circuit 200 of FIG. 2 comprises a pair of resistive elements 202, 204, which are each capable of being programmed to have one of a plurality of resistive states. The resistive elements 202 and 204 may be any type of resistance switching element for which the resistance is programmable by the direction of a current passed through it. For example, as will be described in more detail below with reference to FIGS. 4 and 5, the resistance switching elements 202, 204 are spin transfer torque elements with in-plane or perpendicular-to-plane anisotropy, as described in more detail in the publication entitled "Magnonic spin-transfer torque MRAM with low power, high speed, and error-free switching", N. Mojumder et al., IEDM Tech. Digest (2010), and in the publication entitled "Electric toggling of magnets", E. Tsymbal, Natural Materials Vol 11, January 2012. Alternatively, the resistive elements could be those used in RedOx RAM (reduction oxide RAM) resistive switching memories, which are for example described in more detail in the publication entitled "Redox-Based Resistive Switching Memories—Nanoionic Mechanisms, Prospects and Challenges", Rainer Waser et al., Advanced Materials 2009, 21, pages 2632 to 2663. As yet a further example, the resistive elements could be those used in FeRAM (Ferro-Electric RAM) or in PCRAM (phase change RAM).

Whatever the type of resistive elements, a bit of data is for example stored in a non-volatile manner by setting one of the elements at a relatively high resistance ($R_{max}$), and the other at a relatively low resistance ($R_{min}$). In the example of FIG. 2, the element 202 is programmed to have a resistance $R_{max}$ and the element 204 a resistance $R_{min}$ representing one value of the data bit, and as shown by the references $R_{min}$ and $R_{max}$ in brackets, the opposite programming of the resistance values stores the opposite value of the data bit. Each of the resistance switching elements 202, 204 for example has just two resistive states corresponding to the high and low resistances $R_{max}$ and $R_{min}$, but the exact values of $R_{min}$ and $R_{max}$ may vary depending on conditions such as process, materials, temperature variations etc.

The non-volatile data bit represented by the resistive elements 202, 204 depends on which of the resistive elements is at the resistance $R_{max}$ and $R_{min}$, in other words on the relative resistances. The resistive elements 202, 204 are for example selected such that $R_{max}$ is always significantly greater than $R_{min}$, for example at least 20 percent greater. In general, the ratio between the resistance $R_{max}$ and the resistance $R_{min}$ is for example between 1.2 and 10000. $R_{min}$ is for example in the region of 2 k ohms or less, and $R_{max}$ is for example in the region of 6 k ohms or more, although many other values are possible It will be apparent to those skilled in the art that in some embodiments, rather than both of the resistive elements 202, 204 being programmable, only one is programmable. In such a case, the other resistive element for example has a fixed resistance at an intermediate level around halfway between $R_{min}$ and $R_{max}$, for example equal, within a 10 percent tolerance, to ($R_{min}+(R_{max}-R_{min})/2$). For example, one of the resistive elements 202, 204 could correspond to a resistor of fixed resistance. Alternatively, one of the resistive elements 202, 204 could be formed of a pair of programmable resistive elements coupled in parallel with each other and in opposite orientations, such irrespective of the sense in which each element is programmed, the resistance value remains relatively constant at the intermediate level.

The resistive element 202 is coupled between the storage node $\overline{Q}$ and an intermediate node 206. The resistive element 204 is coupled between the storage node Z and an intermediate node 208. The intermediate nodes 206 and 208 are coupled together via a transistor 210, which is for example an NMOS transistor. Transistor 210 receives at its control node a write signal WR.

The node 206 is further coupled to the ground voltage rail via a transistor 212, which is for example a PMOS transistor. Similarly, the node 208 is further coupled to the ground voltage rail via a transistor 214, which is also for example an NMOS transistor. Control nodes of the transistors 212 and 214 are controlled by a read signal RD.

FIG. 2 also illustrates the inverters 110 and 112 in more detail. Inverter 110 for example comprises a transistor 216, which is for example a PMOS transistor, coupled between the storage node Z and the supply voltage rail VDD. Optionally, for the purpose of balancing the read paths during a restoration phase described in more detail below, a further transistor 217, which is for example a PMOS transistor, is coupled between the transistor 216 and the supply voltage rail VDD. The inverter 110 also for example comprises a transistor 218, which is for example an NMOS transistor, coupled between the storage node Z and a common node 220. In some embodiments the common node 220 is connected to the ground voltage rail, whereas in alternative embodiments as shown in FIG. 2, the common node 220 is coupled to the ground voltage rail via a transistor 222, which is for example an NMOS transistor controlled by a signal Az discussed in more detail below.

Inverter 112 for example comprises a transistor 226, which is for example a PMOS transistor, coupled between the storage node $\overline{Q}$ and the high voltage terminal of the inverter 112. The inverter 112 also for example comprises a transistor 228, which is for example an NMOS transistor, coupled between the storage node $\overline{Q}$ and the low voltage terminal of the inverter 112. The transistors 118 and 120 are coupled between the low voltage terminal of inverter 112 and the common node 220. Optionally, a transistor 230, which is for example a PMOS transistor having its control node coupled to receive the signal Az, is coupled between the storage nodes $\overline{Q}$ and Z.

FIG. 2 also illustrates a control block 232, providing the control signals RD, WR and Az to the corresponding transistors of the circuit 200.

Operation of the circuit 200 of FIG. 2 will now be described with reference to the timing diagram of FIG. 3.

The C-element portion of the circuit 200 is for example capable of normal operation, unaffected by the non-volatile circuit, while signals RD and WR remain low, and the signal Az is high. A back-up phase can be performed periodically or just prior to a power down period, and involves storing the bit represented by the voltage states at the storage nodes $\overline{Q}$ and Z as a programmed resistive state of the resistive elements 202, 204. A restore phase is for example performed after power up, and involves setting the voltage states at the storage nodes $\overline{Q}$ and Z based on the programmed resistive states of the resistive elements 202, 204.

Figure 3:
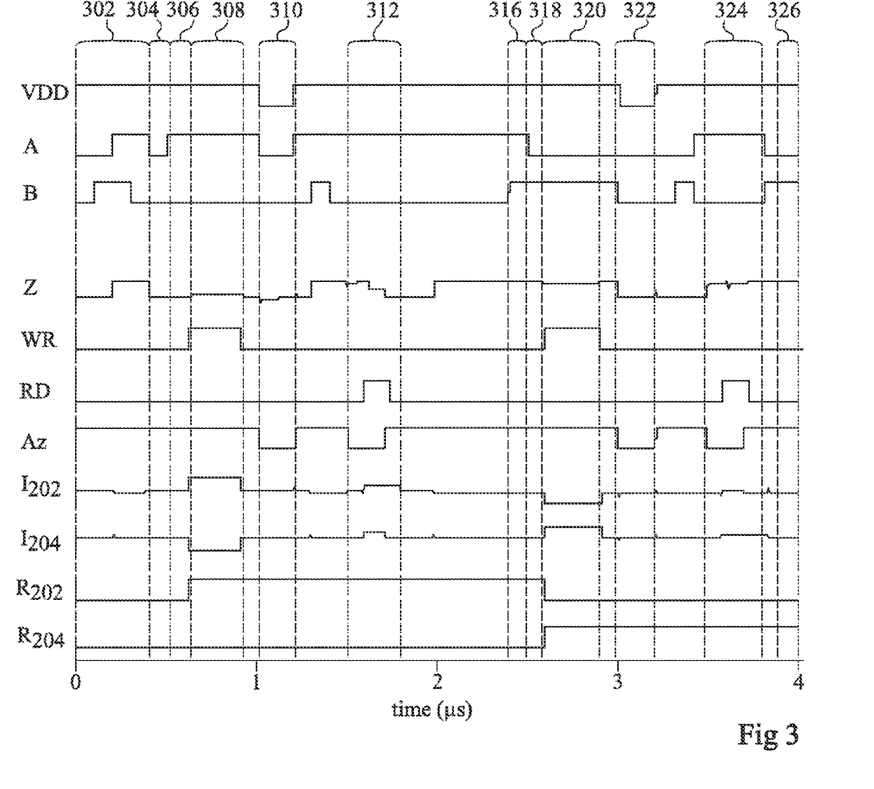
FIG. 3 is a timing diagram showing examples of signals in the circuit of FIG. 2 according to an example embodiment.

FIG. 3 illustrates examples of the voltage VDD on the supply voltage rail, the signals A and B, the voltage at the storage node Z, the write signal WR, the read signal RD, the signal Az, the current $I_{202}$ through the resistive element 202, the current $I_{204}$ through the resistive element 204, the resistance $R_{202}$ of the resistive element 202 corresponding to its magnetic state, and the resistance $R_{204}$ of the resistive element 204 corresponding to its magnetic state.

A first period 302 in FIG. 3 corresponds to a standard operation, in which the signals A and B both transition from a low state to a high state, and Z goes high for a period during which both the signals A and B are high and at least one of the signals remains high.

In a subsequent period 304, a zero state at the storage node Z is set by bringing both the signals A and B low.

Subsequent periods 306 and 308 correspond to a backup phase during which the zero state stored by the storage node Z is stored to the resistive elements 202, 204. This involves an initial step represented by the period 306 in which one of the signals A and B is brought high. This for example corresponds to a standby state being entered by the C-element. Thus at least one of the transistors 114, 116 and at least one of the transistors 118, 120 will be conducting. In the example of FIG. 3, the signal A is brought high. Then, during the period 308, the write signal WR is asserted, which for example causes a positive current to flow through the resistive element 202 and a negative current to flow through the resistive element 204. In particular, with reference to FIG. 2, a dashed line illustrates an example of the path of this write current, which goes from the supply rail VDD through transistors 116 and 226, through the resistive element 202, through the transistor 210, through the resistive element 204 and through the transistors 218 and 222 to the ground rail. Advantageously, generating the write current thus makes use of existing transistors of the C-element.

The write signal WR then goes low again, and a power OFF period 310 occurs during which the voltage VDD on the supply voltage rail is brought low. While the duration of this period is relatively short in the example of FIG. 2, it can be any duration. The signal Az, which is normally high, also for example goes low during the power OFF period 310.

At the end of the power OFF period 310, the voltage VDD and the signal Az are brought high again, and the C-element enters an unpredictable state, in the example of FIG. 3 it being the zero state. The signals A and B are then both asserted to set the state at a logic 1 state, although this step is optional, and serves here only to illustrate that restoration is possible irrespective of the initial state of the C-element.

In a subsequent period 312, a restoration phase occurs, in which the signal Az is brought low. This has the effect of bringing the voltage at the storage nodes to an intermediate level. Furthermore, the signal RD is brought high to render conductive the transistors 212 and 214, and generate currents through each of the resistive elements 202, 204. The level of current through each resistive element 202, 204 will depend on its programmed resistance. Then, when the signal Az is brought high again, the unbalanced current in each branch cause the voltage at the storage node Z to go to the low value. The signal RD then goes low to render the transistors 212 and 214 non-conductive.

During subsequent periods 316 to 326, the same operations occur as during the periods 304 to 312, except that a logic 1 state is programmed at the storage node Z rather than the zero state. It should be noted that in the period 318 one of the signals A and B is brought low to ensure that at least one of the transistors 114, 116 and at least one the transistors 118, 120 is conductive. As shown by a dashed-dotted arrow in FIG. 2, the write current during the period 320 will flow from the supply rail VDD through transistors 217 and 216, through the resistive element 204, through the transistor 210, through the resistive element 202 and through the transistors 120 and 222 to the ground rail.

Figure 4:
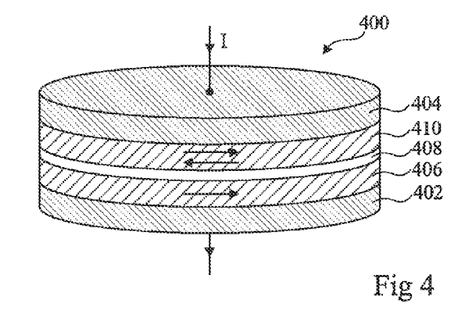
FIG. 4 illustrates a resistive element of the circuit of FIG. 2 in more detail according to an example embodiment.
Figure 5:
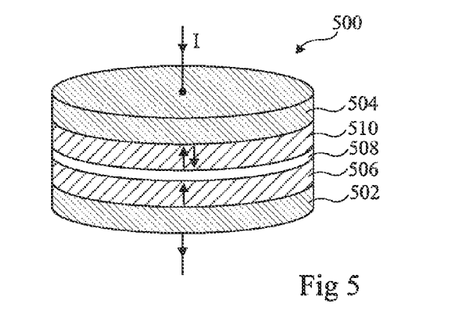
FIG. 5 illustrates a resistive element of the circuit of FIG. 2 in more detail according to a further example embodiment.

FIGS. 4 and 5 illustrate the structures of resistive spin transfer torque (STT) elements according to example embodiments. For example, the resistive element 202 and/or 204 of FIG. 2 each has a structure corresponding to that of FIG. 4 or 5. Alternatively, as mentioned above, the resistive elements could be redOx RAM elements, FeRAM elements, PCRAM elements, or other types of resistive elements having a resistance programmable by the direction of current flow.

FIG. 4 illustrates an STT resistive element 400 with in-plane magnetic anisotropy. The element 400 is for example substantially cylindrical, but has a cross-section which is non-circular, for example oval, which leads for example to an increase in the retention stability of the resistive states when the device is programmed.

The element 400 comprises bottom and top electrodes 402 and 404, each being substantially disc-shaped, and sandwiching a number of intermediate layers between them. The intermediate layers comprise, from bottom to top, a pinned layer 406, an oxidation barrier 408, and a storage layer 410.

The oxidation barrier 408 is for example formed of MgO or $Al_xO_y$. The pinned layer 406 and storage layer 410 are for example ferromagnetic materials, such as CoFe. The spin direction in the pinned layer 406 is fixed, as represented by an arrow from left to right in FIG. 4. Of course, in alternative embodiments the spin direction could be from right to left in the pinned layer 406. However, the spin direction in the storage layer 410 can be changed, as represented by arrows in opposing directions in FIG. 4. The spin direction is programmed by the direction of the write current I passed through the element, such that the spin direction in the storage layer is parallel, in other words in the same direction, or anti-parallel, in other words in the opposite direction, to that of the pinned layer 406.

FIG. 5 illustrates an STT resistive element 500 with perpendicular-to-plane magnetic anisotropy. Such a resistive element can for example be programmed by a lower write current I than the element 400 for a given size and/or for a given storage layer volume.

Element 500 is substantially cylindrical, and for example has a cross-section which is circular. The element 500 comprises bottom and top electrodes 502 and 504, each being substantially disc-shaped and sandwiching a number of intermediate layers. The intermediate layers comprise, from bottom to top, a pinned layer 506, an oxidation barrier 508, and a storage layer 510. These layers are similar to the corresponding layers 406, 408 and 410 of element 400, except that the pinned layer 506 and storage layer 510 have perpendicular-to-plane anisotropy, as represented by the vertical arrows in layers 506 and 510 of FIG. 5. The pinned layer 506 is illustrated as having a spin direction from bottom to top in FIG. 5, but of course, in alternative embodiments, this spin direction could be from top to bottom.

If the STT element 400 or 500 of FIG. 4 or 5 is used to implement each of the resistive elements 202, 204 described herein, their orientations can for example be chosen to minimize the level of write current that allows them to be programmed. In particular, depending on factors such as the dimensions of the elements 202, 204, a low write current may be possible when each element has its bottom electrode 402, 502 connected to the corresponding storage node $\overline{Q}$, Z, or the opposite may be true.

Figure 6:
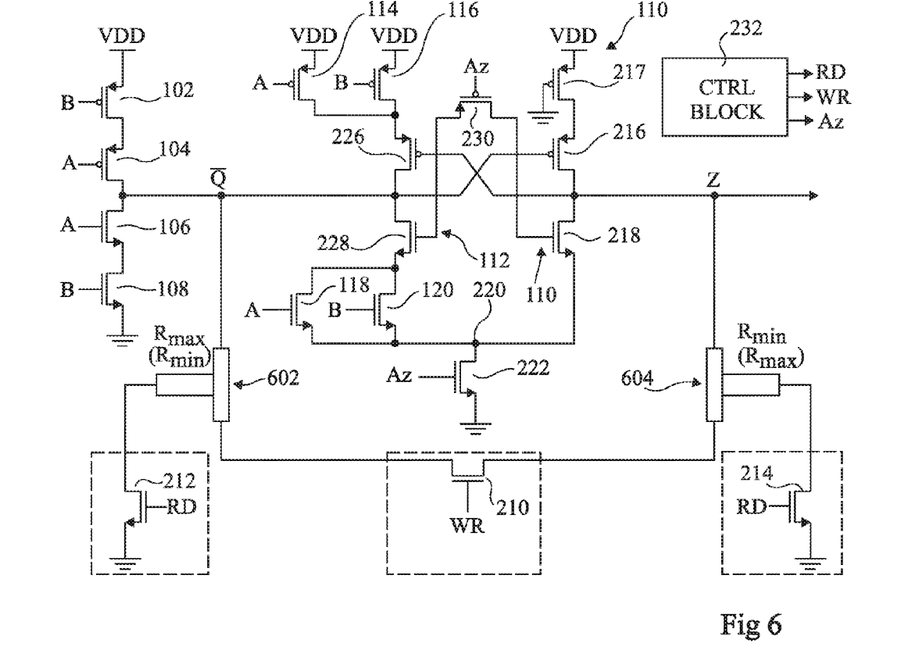
FIG. 6 schematically illustrates a circuit comprising a C-element and a non-volatile memory according to a further example embodiment of the present disclosure.

FIG. 6 schematically illustrates a circuit 600 according to an alternative embodiment very similar to that of FIG. 2, and like features are labelled with like reference numerals and will not be described again in detail. However, in the embodiment of FIG. 6, the resistive elements 202, 204 have been replaced by resistive elements 602, 604 respectively, each of which is a three-terminal device, as will now be described with reference to FIG. 7.

Figure 7:
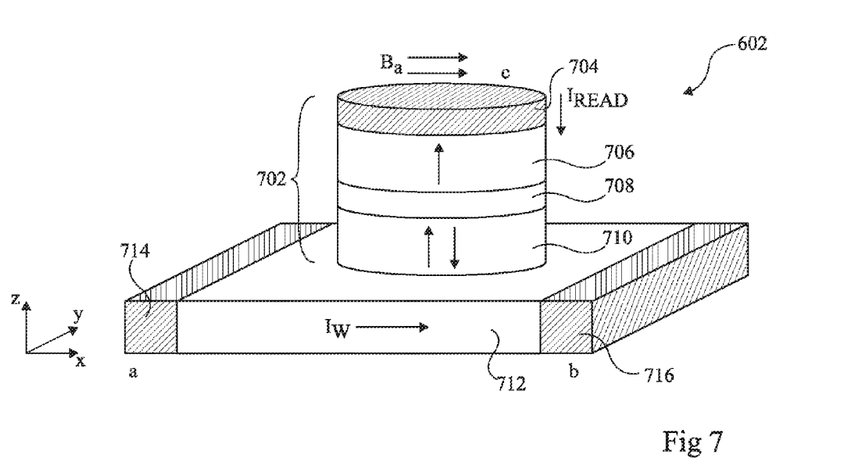
FIG. 7 illustrates a resistive element of the circuit of FIG. 6 in more detail according to an example embodiment.

FIG. 7 illustrates, in perspective view, the resistive element 602 of FIG. 6 in more detail according to an example embodiment. The resistive element 604 for example has a similar structure.

The resistive element 602 is for example a spin-orbit torque magnetic tunnel junction (SOT-MTJ). Such a device is for example described in more detail in the publication titled "Voltage and Energy-Delay Performance of Giant Spin Hall Effect Switching for Magnetic Memory and Logic", S. Manipatruni et al., and in the publication titled "Spin-Torque Switching with the Giant Spin Hall Effect of Tantalum", Luqiao Liu et al., DOI: 10.1126/science.1218197 Science 336, 555 (2012), the contents of of these publications being hereby incorporated by reference to the extent allowable by the law.

The resistive memory element 602 comprises three connection terminals, labelled a, b and c in FIG. 7. The terminal c is part of a resistive stack 702, which comprises an electrode 704 formed over a reference nano-magnet layer 706. Layer 706 is in turn formed over an insulator layer 708, and layer 708 is in turn formed over a storage nano-magnet layer 710.

The reference layer 706 corresponds to a magnetic layer in which the direction of magnetization is fixed. The storage layer 710 on the contrary corresponds to a magnetic layer in which the direction of magnetization can be controlled.

The resistive stack 702 is formed over a conducting layer 712, which provides the interface for programming the direction of magnetization of the storage layer 710. The conducting layer 712 is for example formed of: β-tantalum (β-Ta); β-tungsten (β-W); and/or platinum (Pt), and for example comprises, at opposing ends, an electrode 714 forming a terminal a of the element 700 and an electrode 716 forming a terminal b of the element 700. The electrodes 714, 716 are for example each formed of copper, or another suitable material.

As shown by arrows $B_a$ in FIG. 7, a static magnetic field, for example provided by a permanent magnet or a bias layer, is for example present close to the reference layer 706. Such a magnetic field is for example discussed in more detail in the publication titled "Perpendicular switching of a single ferromagnetic layer induced by in-plane current injection" Ioan mihai Miron et al., Nature 476, 189-193, DOI: 10.1038/nature10309.11, August 2011, the contents of which is hereby incorporated by reference to the extent allowable by the law.

During a write operation, a current is applied from the terminal a towards the terminal b, or in the opposite direction, in order to program the direction of magnetization in the storage layer 710. As shown by arrows x, y, and z in FIG. 7, the direction of the write current $I_W$ flowing through the conducting layer 712 from terminal a towards terminal b will be called the +x direction, the direction perpendicular to +x direction in the plane of the conducting layer will be called the +y direction, and the upward direction perpendicular to +x and +y directions will be called the +z direction. A positive write current $I_W$ in the +x direction will produce a spin injection current with transport direction in the +z direction, and spins pointing in the +y direction. The injected spin current in the +z direction will in turn produce spin torque to align the magnet in the +y direction. A negative write current $I_W$ in the −x direction will produce a spin injection current with transport direction in the −z direction, and spins pointing in the −y direction. The injected spin current in the −z direction will in turn produce spin torque to align the magnet in the −y direction.

When the direction of magnetization in the storage layer 710 is the same as that of the reference layer 706, the resistance of the resistive stack 702 is for example at a relatively low value $R_{min}$. When the direction of magnetization in the storage layer 710 is opposite to that of the reference layer 706, the resistance of the resistive stack 702 is for example at a relatively high value $R_{max}$.

It will be apparent to those skilled in the art that the structure represented in FIG. 7 provides just one example of a possible structure of a three-terminal programmable resistive element. In alternative embodiments, one or more additional layers could be included, and different combinations of materials could be used. Furthermore, it will be apparent to those skilled in the art that an additional read node could be provided, for example on the underside of the conducting layer 712, or elsewhere, such that the electrodes 714 and 716 are used exclusively for writing.

Operation of the circuit of FIG. 6 is very similar to that of FIG. 2, and will not be described in detail.

An advantage of the embodiments described herein is that, by performing a backup phase during a standby phase of the C-element during which the signals A and B have different logic levels, the transistors already present in the C-element can be used to conduct the write current for programming the resistive states of the resistive elements.

Having thus described at least one illustrative embodiment, various alterations, modifications and improvements will readily occur to those skilled in the art.

For example, it will be apparent to those skilled in the art that the supply voltage VDD in the various embodiments could be at any level, for example between 1 and 3 V, and rather than being at 0 V, the ground voltage can also be considered as a supply voltage that could be at any level, such as a negative level.

Furthermore, it will be apparent to those skilled in the art that, in any of the embodiments described herein, all of the NMOS transistors could be replaced by PMOS transistors and/or all of the PMOS transistors could be replaced by NMOS transistors. It will be apparent to those skilled in the art how any of the circuits could be implemented using only PMOS or only NMOS transistors, for example by inverting the supply rails. Furthermore, while transistors based on MOS technology are described throughout, in alternative embodiments other transistor technologies could be used, such as bipolar technology.

Furthermore, it will be apparent to those skilled in the art that the various features described in relation to the various embodiments could be combined, in alternative embodiments, in any combination.

The invention claimed is:

1. A circuit comprising:
   a C-element having first and second input nodes and first and second inverters cross-coupled between first and second complementary storage nodes, the second storage node forming an output node of the C-element; and
   a non-volatile memory comprising:
      a first resistive element having a first terminal coupled to the first storage node;
      a second resistive element having a first terminal coupled to the second storage node, at least one of the first and second resistive elements being programmable to have one of at least two resistive states, a data value being represented by the relative resistances of the first and second resistive elements, wherein a second terminal of the first resistive element is coupled to a second terminal of the second resistive element via a write transistor; and
      a control block configured, during a backup phase of a data bit stored at the first and second storage nodes to the non-volatile memory, to render conductive the write transistor while different logic levels are applied to the first and second input nodes of the C-element.

2. The circuit of claim 1, wherein the write transistor is adapted to conduct a write current during the backup phase, and wherein the circuit is arranged such that the write current passes through at least one transistor of each of the first and second inverters during the backup phase.

3. The circuit of claim 1, wherein:
   the C-element is adapted to receive a first input signal at the first input node and a second input signal at the second input node; and
   the first inverter comprises: first and second transistors having at least one of their control nodes coupled to the first or second storage node; third and fourth transistors coupled in parallel with each other and coupling the first transistor of the first inverter to a supply voltage rail; and fifth and sixth transistors coupled in parallel with each other and coupling the second transistor of the first inverter to a ground voltage rail.

4. The circuit of claim 3, wherein the second inverter comprises: seventh and eighth transistors having at least one of their control nodes coupled to the second or first storage node; and a ninth transistor coupling a seventh transistor of the second inverter to the supply voltage rail and having its control node coupled to the ground voltage rail.

5. The circuit of claim 4, wherein the fifth and sixth transistors of the first inverter and a eighth transistor of the second inverter are coupled to a common node, the circuit further comprising a tenth transistor coupled between the common node and the ground voltage rail.

6. The circuit of claim 1, further comprising a first read transistor coupled between the first resistive element and a ground voltage rail and a second read transistor coupled between the second resistive element and the ground voltage rail, wherein the control block is further configured to render conductive the first and second read transistors during a restore phase of the data bit stored by the first and second to the storage nodes.

7. The circuit of claim 6, wherein the first read transistor is coupled to the second terminal of the first resistive element, and the second read transistor is coupled to the second terminal of the second resistive element.

8. The circuit of claim 6, wherein the first and second resistive elements each comprise a third terminal, and wherein the first read transistor is coupled to the third terminal of the first resistive element, and the second transistor is coupled to the third terminal of the second resistive element.

9. The circuit of claim 8, wherein said first and second resistive elements are of a spin orbit torque magnetic tunnel junction (SOT-MTJ) type.

10. The circuit of claim 1, wherein at least one of said first and second resistive elements is one of:
    a spin transfer torque element with in-plane anisotropy;
    a spin transfer torque element with perpendicular-to-plane anisotropy;
    a reduction oxide (RedOx) element;
    a ferro-electric element; and
    a phase change element.

11. An integrated circuit comprising a plurality of asynchronous blocks each comprising the circuit of claim 1.

12. A method of data backup in a circuit comprising: providing a C-element having first and second input nodes and first and second inverters cross-coupled between first and second complementary storage nodes, the second storage node forming an output node of the C-element; providing a non-volatile memory comprising: a first resistive element having a first terminal coupled to the first storage node; a second resistive element having a first terminal coupled to the second storage node, at least one of the first and second resistive elements being programmable to have one of at least two resistive states, a data value being represented by the relative resistances of the first and second resistive elements, wherein a second terminal of the first resistive element is coupled to a second terminal of the second resistive element via a write transistor; and rendering conductive the write transistor while different logic levels are applied to the first and second input nodes of the C-element.

* * * * *